(12) United States Patent
Kanungo et al.

(10) Patent No.: US 8,907,998 B2
(45) Date of Patent: Dec. 9, 2014

(54) APPARATUS AND METHODS FOR INK-BASED DIGITAL PRINTING USING IMAGING PLATE HAVING REGULAR TEXTURED SURFACE FOR REDUCED PULLBACK

(71) Applicants: Xerox Corporation, Norwalk, CT (US); Palo Alto Research Center Incorporated, Palo Alto, CA (US)

(72) Inventors: Mandakini Kanungo, Penfield, NY (US); Srinivas Mettu, Webster, NY (US); Timothy D. Stowe, Alameda, CA (US); Ashish Pattekar, Cupertino, CA (US)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/747,465

(22) Filed: Jan. 22, 2013

(65) Prior Publication Data
US 2014/0204171 A1  Jul. 24, 2014

(51) Int. Cl.
*B41J 2/435* (2006.01)
*B41J 2/47* (2006.01)
*B41M 1/00* (2006.01)

(52) U.S. Cl.
CPC .................................... *B41J 2/435* (2013.01)
USPC .......................................... 347/225; 101/453

(58) Field of Classification Search
USPC ........... 347/224, 225; 427/149, 387; 101/466, 101/451–453, 460, 462, 465; 378/34
See application file for complete search history.

(56) References Cited

U.S. PATENT DOCUMENTS

| | | | | |
|---|---|---|---|---|
| 6,626,531 | B2 * | 9/2003 | Fujii et al. | 347/105 |
| 7,005,162 | B2 * | 2/2006 | Engle et al. | 427/265 |
| 7,935,397 | B2 * | 5/2011 | Okuda et al. | 428/32.2 |
| 2012/0103212 | A1 | 5/2012 | Stowe et al. | |
| 2013/0104756 | A1 | 5/2013 | Stowe et al. | |

\* cited by examiner

*Primary Examiner* — Hai C Pham
(74) *Attorney, Agent, or Firm* — Ronald E. Prass, Jr.; Prass LLP

(57) ABSTRACT

An ink-based digital printing apparatus includes an imaging member having a surface layer with regular texture. The regular texture includes an array of microstructures such as cavities. Methods include forming the imaging member textured surface using photolithography and molding processes.

4 Claims, 10 Drawing Sheets

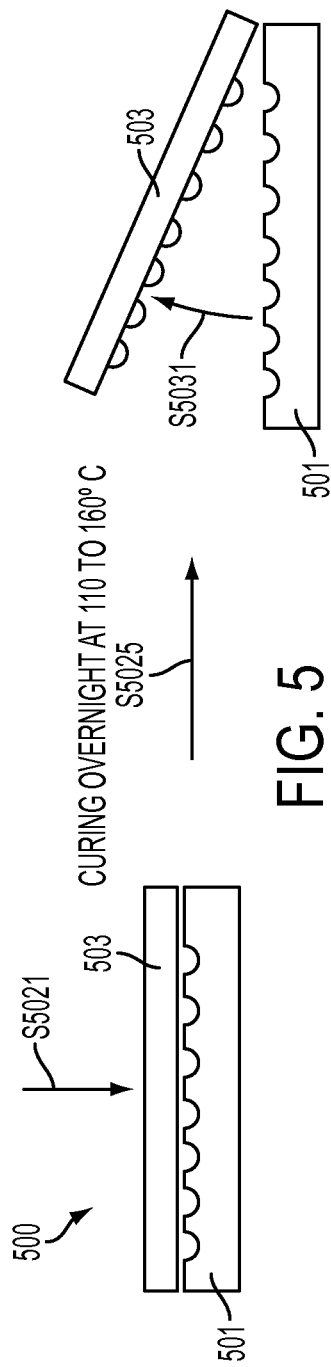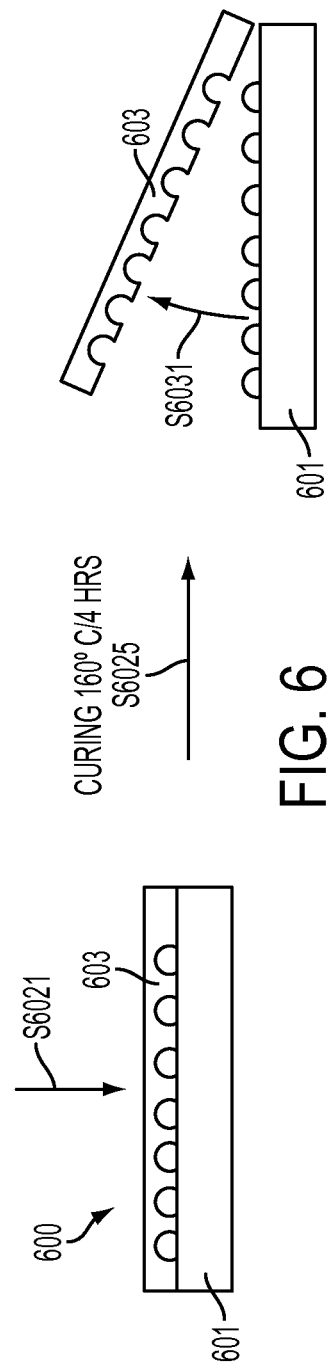

APPARATUS AND METHODS FOR INK-BASED DIGITAL PRINTING USING IMAGING PLATE HAVING REGULAR TEXTURED SURFACE FOR REDUCED PULLBACK

FIELD OF DISCLOSURE

The disclosure relates to ink-based digital printing. In particular, the disclosure relates to methods and systems for ink-based digital printing using an imaging plate configured with a fluorosilicone surface having an array of microstructures arranged to reduce ink image defects and improve feature sharpness by reducing dampening fluid or fountain solution pullback.

BACKGROUND

Related art ink-based digital printing systems, or variable data lithography systems configured for digital lithographic printing, include an imaging system for laser patterning a layer of dampening fluid applied to an imaging member having a reimageable surface layer constituting an imaging plate or blanket. The dampening fluid layer may be applied by, for example, splitting dampening fluid between a delivery roller and the imaging member surface, wherein the delivery roller contacts the imaging member surface. The dampening fluid layer is laser-patterned according to image data using the imaging system. In particular, the laser applied to the smooth fluorosilicone plate surface evaporates select portions, or imaging portions, of the dampening fluid layer disposed thereon.

SUMMARY

Apparatus and methods are desired for reducing pullback of imaging areas into non-imaging areas of a dampening fluid layer on an imaging member during laser patterning. Apparatus and methods are provided that reduce pullback and provides good image quality using a textured imaging member surface.

In an embodiment, an imaging member for ink-based digital printing may include a textured imaging surface, the textured imaging surface having a plurality of microstructures arranged in a regular pattern configured for enhancing control over wetting and dewetting of dampening fluid. The textured imaging surface may further include materials selected from the group comprising silicone, fluorosilicone, fluoroelastomers (FKMs), and hybrids of FKMs, fluorosilicones, and silicones.

In an embodiment, the plurality of microstructures may include protrusions extending from the imaging member surface. The textured imaging surface may include iron oxide or carbon black or graphene or carbon nanotube or any other suitable Infrared (IR) absorbing fillers.

In an embodiment, the plurality of microstructures may include cavities, the cavities being defined by the imaging member surface. The cavities may be arranged whereby adjacent cavities are equally spaced from each other by a distance of 0.5 microns to 6 microns.

In an embodiment having protrusions, the protrusions may have a height lying in a range of 0.1 microns to 1.0 micron. In another embodiment, the protrusions may have a height lying in a range of 0.2 microns to 0.7 microns.

In an embodiment, the cavities have a depth lying in a range of 0.1 microns to 1.0 micron. In another embodiment, the cavities have a depth lying in a range of 0.2 microns to 0.7 microns.

In an embodiment, methods of forming an imaging member configured for ink-based digital printing, the imaging member having a regular textured surface configured for enhancing control over wetting and dewetting of dampening fluid or fountain solution, may include applying uncured imaging layer material to a mold whereby the uncured imaging layer material conforms to a surface of the mold; curing the applied imaging layer material to form a solid imaging member surface layer; and removing the cured solid imaging member surface layer, the cured imaging member surface layer having a regular texture comprising microstructures that correspond to the surface of the mold.

In an embodiment, the mold may be a silicon mold comprising cavities in a surface thereof, the method further including forming the silicon mold by applying negative photoresist material to a surface of a silicon substrate; baking the photoresist material on the silicon substrate; exposing and developing the photoresist material using a mask having a feature size of 3 micron and center to center spacing of 4.5 micron; etching the patterned photoresist material and corresponding silicon; and stripping the etched photoresist, whereby the silicon substrate defines cavities having a depth lying in a range of 0.5 microns to 1 microns.

In an embodiment, methods may include the mold being a silicon mold comprising cavities in a surface thereof, the methods forming the silicon mold by applying positive photoresist material to a surface of a silicon substrate; baking the photoresist material on the silicon substrate; exposing and developing the photoresist material using a mask having a feature size of 3 microns and center to center spacing of 4.5 microns; etching the patterned photoresist material and corresponding silicon; and stripping the etched photoresist, whereby the silicon substrate defines cavities having a depth lying in a range of 0.5 microns to 1 microns.

In an embodiment, methods may include the mold being a silicon mold comprising cavities having a diameter lying in the range of 0.1 microns to 6 microns, a center-to-center spacing of 0.1 microns to 6 microns, and a depth of 0.1 microns to 1 micron, the cavities being formed by photolithography, e-beam lithography, or laser irradiation.

In an embodiment, the microstructures of the imaging member surface layer may include cavities having a depth lying in a range of 0.1 microns to 1.0 micron. In another embodiment, the microstructures of the imaging member surface layer may have cavities having a depth lying in a range of 0.2 microns to 0.5 microns. In an embodiment, the microstructures of the imaging member surface layer may include protrusions.

In an embodiment wherein the mold comprises silicone, fluorosilicone, FKMs or hybrid of FKMs, silicones, and fluorosilicones, the mold formed using a silicon mold having cavities patterned thereon, methods may include the forming the fluorosilicone mold including applying material comprising fluorosilicone to a silicon mold having cavities formed therein; curing the applied material overnight at 160 degrees Celsius to form a solid fluorosilicone mold having protrusions that correspond to the cavities of the silicon mold; and removing the fluorosilicone mold from the silicon mold.

In an embodiment, methods may include the forming the imaging member surface layer further including applying imaging layer material to a surface of the silicone/fluorosilicone, FKMs or hybrid of FKMs and silicones/fluorosilicones mold whereby the imaging layer material conforms to the surface of the appropriate (silicone/fluorosilicone, FKMs or hybrid of FKMs and silicones/fluorosilicones) mold; curing the applied imaging layer material at appropriate temperatures from 70-220 Celsius for 2 hours to overnight to form a solid imaging layer material having cavities formed therein that correspond to the protrusions of the fluorosilicone mold; and removing the solid imaging layer material. In an embodiment, methods may include the solid imaging layer material comprising silicone/fluorosilicone, FKMs or hybrid of FKMs and silicones/fluorosilicones and an appropriate IR imaging filler such as iron oxide, carbon black, graphene, carbon nanotubes in the form of pristine or modified form wherein the microstructures of the imaging member surface layer comprise the cavities formed in the solid imaging layer material.

Exemplary embodiments are described herein. It is envisioned, however, that any system that incorporates features of apparatus and systems described herein are encompassed by the scope and spirit of the exemplary embodiments.

BRIEF DESCRIPTION OF THE DRAWINGS

FIG. 5 shows an imaging member forming process having bumps in accordance with an embodiment;

FIG. 6 shows an imaging member forming process having cavities in accordance with an embodiment;

DETAILED DESCRIPTION

Figure 1:
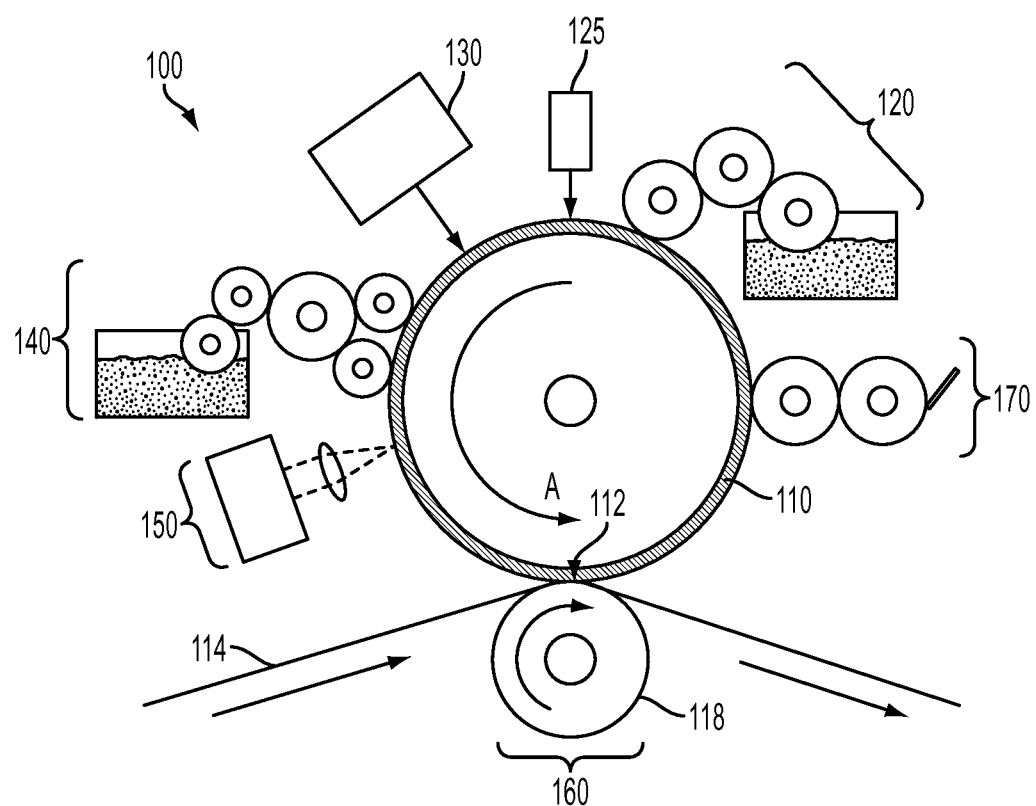
FIG. 1 shows a diagrammatical side view of a related art ink-based digital printing system.

Exemplary embodiments are intended to cover all alternatives, modifications, and equivalents as may be included within the spirit and scope of the apparatus and systems as described herein.

Reference is made to the drawings to accommodate understanding of a textured imaging member for ink-based digital printing, and methods for producing the same. In the drawings, like reference numerals are used throughout to designate similar or identical elements. The drawings depict various embodiments of illustrative apparatus and methods for ink-based digital printing using an imaging member having a textured surface including a regular array of microstructures.

U.S. patent application Ser. No. 13/095,714 ("714 Application"), which is commonly assigned and the disclosure of which is incorporated by reference herein in its entirety, proposes systems and methods for providing variable data lithographic and offset lithographic printing or image receiving medium marking. The systems and methods disclosed in the 714 Application are directed to improvements on various aspects of previously-attempted variable data imaging lithographic marking concepts based on variable patterning of dampening fluids to achieve effective truly variable digital data lithographic printing.

According to the 714 Application, a reimageable surface is provided on an imaging member, which may be a drum, plate, belt or the like. The reimageable surface may be composed of, for example, a class of materials commonly referred to as silicones, including polydimethylsiloxane (PDMS) among others. The reimageable surface may be formed of a relatively thin layer over a mounting layer, a thickness of the relatively thin layer being selected to balance printing or marking performance, durability and manufacturability.

The 714 Application describes an exemplary variable data lithography system 100 for ink-based digital printing, such as that shown, for example, in FIG. 1. A general description of the exemplary system 100 shown in FIG. 1 is provided here. Additional details regarding individual components and/or subsystems shown in the exemplary system 100 of FIG. 1 may be found in the 714 Application.

As shown in FIG. 1, the exemplary system 100 may include an imaging member 110. The imaging member 110 in the embodiment shown in FIG. 1 is a drum, but this exemplary depiction should not be interpreted so as to exclude embodiments wherein the imaging member 110 includes a drum, plate or a belt, or another now known or later developed configuration. The imaging member 110 is used to apply an ink image to an image receiving media substrate 114 at a transfer nip 112. The transfer nip 112 is formed by an impression roller 118, as part of an image transfer mechanism 160, exerting pressure in the direction of the imaging member 110. Image receiving medium substrate 114 should not be considered to be limited to any particular composition such as, for example, paper, plastic, or composite sheet film. The exemplary system 100 may be used for producing images on a wide variety of image receiving media substrates. The 714 Application also explains the wide latitude of marking (printing)

materials that may be used, including marking materials with pigment densities greater than 10% by weight. As does the 714 Application, this disclosure will use the term ink to refer to a broad range of printing or marking materials to include those which are commonly understood to be inks, pigments, and other materials which may be applied by the exemplary system 100 to produce an output image on the image receiving media substrate 114.

The 714 Application depicts and describes details of the imaging member 110 including the imaging member 110 being comprised of a reimageable surface layer formed over a structural mounting layer that may be, for example, a cylindrical core, or one or more structural layers over a cylindrical core.

The exemplary system 100 includes a dampening fluid subsystem 120 generally comprising a series of rollers, which may be considered as dampening rollers or a dampening unit, for uniformly wetting the reimageable surface of the imaging member 110 with dampening fluid. A purpose of the dampening fluid subsystem 120 is to deliver a layer of dampening fluid, generally having a uniform and controlled thickness, to the reimageable surface of the imaging member 110. As indicated above, it is known that a dampening fluid such as fountain solution may comprise mainly water optionally with small amounts of isopropyl alcohol or ethanol added to reduce surface tension as well as to lower evaporation energy necessary to support subsequent laser patterning, as will be described in greater detail below. Small amounts of certain surfactants may be added to the fountain solution as well. Alternatively, other suitable dampening fluids may be used to enhance the performance of ink based digital lithography systems. Suitable dampening fluids are disclosed, by way of example, in co-pending U.S. patent application Ser. No. 13/284,114, titled DAMPENING FLUID FOR DIGITAL LITHOGRAPHIC PRINTING, the disclosure of which is incorporated herein by reference in its entirety.

Once the dampening fluid is metered onto the reimageable surface of the imaging member 110, a thickness of the dampening fluid may be measured using a sensor 125 that may provide feedback to control the metering of the dampening fluid onto the reimageable surface of the imaging member 110 by the dampening fluid subsystem 120.

Once a precise and uniform amount of dampening fluid is provided by the dampening fluid subsystem 120 on the reimageable surface of the imaging member 110, and optical patterning subsystem 130 may be used to selectively form a latent image in the uniform dampening fluid layer by imagewise patterning the dampening fluid layer using, for example, laser energy. Typically, the dampening fluid will not absorb the optical energy (IR or visible) efficiently. The reimageable surface of the imaging member 110 should ideally absorb most of the laser energy (visible or invisible such as IR) emitted from the optical patterning subsystem 130 close to the surface to minimize energy wasted in heating the dampening fluid and to minimize lateral spreading of heat in order to maintain a high spatial resolution capability. Alternatively, an appropriate radiation sensitive component may be added to the dampening fluid to aid in the absorption of the incident radiant laser energy. While the optical patterning subsystem 130 is described above as being a laser emitter, it should be understood that a variety of different systems may be used to deliver the optical energy to pattern the dampening fluid.

The mechanics at work in the patterning process undertaken by the optical patterning subsystem 130 of the exemplary system 100 are described in detail with reference to FIG. 5 in the 714 Application. Briefly, the application of optical patterning energy from the optical patterning subsystem 130 results in selective removal of portions of the layer of dampening fluid.

Following patterning of the dampening fluid layer by the optical patterning subsystem 130, the patterned layer over the reimageable surface of the imaging member 110 is presented to an inker subsystem 140. The inker subsystem 140 is used to apply a uniform layer of ink over the layer of dampening fluid and the reimageable surface layer of the imaging member 110. The inker subsystem 140 may use an anilox roller to meter an offset lithographic ink onto one or more ink forming rollers that are in contact with the reimageable surface layer of the imaging member 110. Separately, the inker subsystem 140 may include other traditional elements such as a series of metering rollers to provide a precise feed rate of ink to the reimageable surface. The inker subsystem 140 may deposit the ink to the pockets representing the imaged portions of the reimageable surface, while ink on the unformatted portions of the dampening fluid will not adhere to those portions.

The cohesiveness and viscosity of the ink residing in the reimageable layer of the imaging member 110 may be modified by a number of mechanisms. One such mechanism may involve the use of a rheology (complex viscoelastic modulus) control subsystem 150. The rheology control system 150 may form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the reimageable surface of the imaging member 110 to a substrate of image receiving medium 114 using a transfer subsystem 160. The transfer occurs as the substrate 114 is passed through a nip 112 between the imaging member 110 and an impression roller 118 such that the ink within the voids of the reimageable surface of the imaging member 110 is brought into physical contact with the substrate 114. With the adhesion of the ink having been modified by the rheology control system 150, modified adhesion of the ink causes the ink to adhere to the substrate 114 and to separate from the reimageable surface of the imaging member 110. Careful control of the temperature and pressure conditions at the transfer nip 112 may allow transfer efficiencies for the ink from the reimageable surface of the imaging member 110 to the substrate 114 to exceed 95%. While it is possible that some dampening fluid may also wet substrate 114, the volume of such a dampening fluid will be minimal, and will rapidly evaporate or be absorbed by the substrate 114.

In certain offset lithographic systems, it should be recognized that an offset roller, not shown in FIG. 1, may first receive the ink image pattern and then transfer the ink image pattern to a substrate according to a known indirect transfer method.

Following the transfer of the majority of the ink to the substrate 114, any residual ink and/or residual dampening fluid must be removed from the reimageable surface of the imaging member 110, preferably without scraping or wearing that surface. An air knife may be employed to remove residual dampening fluid. It is anticipated, however, that some amount of ink residue may remain. Removal of such remaining ink residue may be accomplished through use of some form of cleaning subsystem 170. The 714 Application describes details of such a cleaning subsystem 170 including at least a first cleaning member such as a sticky or tacky member in physical contact with the reimageable surface of the imaging member 110, the sticky or tacky member removing residual ink and any remaining small amounts of surfactant compounds from the dampening fluid of the reimageable surface of the imaging member 110. The sticky or tacky member may then be brought into contact with a smooth roller to which residual ink may be transferred from the sticky or tacky member, the ink being subsequently stripped from the smooth roller by, for example, a doctor blade.

The 714 Application details other mechanisms by which cleaning of the reimageable surface of the imaging member 110 may be facilitated. Regardless of the cleaning mechanism, however, cleaning of the residual ink and dampening fluid from the reimageable surface of the imaging member 110 is essential to preventing ghosting in the proposed system. Once cleaned, the reimageable surface of the imaging member 110 is again presented to the dampening fluid subsystem 120 by which a fresh layer of dampening fluid is supplied to the reimageable surface of the imaging member 110, and the process is repeated.

According to the above proposed structure, variable data digital lithography has attracted attention in producing truly variable digital images in a lithographic image forming system. The above-described architecture combines the functions of the imaging plate and potentially a transfer blanket into a single imaging member 110 that must have a light absorptive surface.

As discussed above, in variable data lithography printing, a dampening fluid or fountain solution is applied to an imaging plate, which comprises an imaging surface having IR absorptive material such as carbon black in a silicone elastomer. The applied fluid is selectively removed by an IR laser at imaging areas according to image data to produce a latent image that is then developed with offset ink. The digital ink image may be transferred to a substrate such as paper, and fixed to the substrate by curing. The imaging plate is configured for wetting by dampening fluid or fountain solution, generating a latent image according to variable image data, inking with offset ink, and enabling the ink image to lift off the substrate.

An example plate and fountain solution material set includes fully fluorinated fluorosilicone and D4 (octamethyltetrasiloxane), respectively. When the laser contacts the smooth fluorosilicone plate and evaporates fountain solution in imaging areas, edges of imaging areas pullback and move into non-imaging areas. This pullback of edges is due to Marangoni flow caused by the temperature gradient between imaging and non-imaging areas, combined with low friction for the movement of edges of fountain solution on the smooth plate. A surface texture of the imaging plate plays a critical role in pinning of edges of fountain solution due to increased resistance. This is important for achieving desired image quality in the print process, e.g., printing sharp edges and corners in halftones.

Some related art imaging plates have been formed with texturing from Agfa or an Allied mold wherein the texturing is random. It has been found that the random texture has limited ability to control wetting of D4 on fluorosilicone plates. As such, regular or uniform, patterned texture is desired for imaging plate imaging surfaces for ink-based digital printing.

Figure 2:
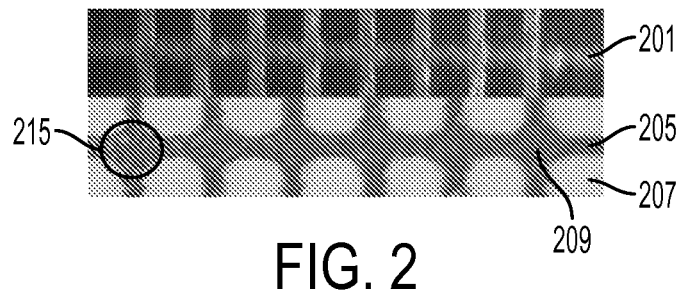
FIG. 2 shows an upper image of a regular pattern to be printed and lower image of a digitally printed offset ink image using a randomly textured imaging member.

FIG. 2 shows an imaging plate surface in accordance with an exemplary embodiment. In particular, FIG. 2 shows an upper image 201 of an image to be printed or how the resulting image should look like after getting printed. FIG. 2 shows a lower image 205 of a printed image that was printed using a randomly textured imaging plate. The lower image 205 shows a non-imaging area 207 and an imaging area 209. The imaging area 209 bleeds into the non-imaging area due to pull back as shown at the imaging area intersection 215.

By way of example, the regular or patterned texture may be formed by generating a regular array of microscopic cavities on the fluorosilicone plate with a center to center spacing of 0.5 microns to 6 microns and depth of 0.2 microns to 1 micron by photolithography, e-beam lithography, patterned ion irradiation and/or molding methods now known or later developed. It has been found that the contact line or edge of the fountain solution can be pinned to surfaces most suitably where microstructures such as cavities are closely spaced. On the other hand, the fountain solution has been found to spread uncontrollably on smooth and Agfa-textured plate surfaces, or surfaces having random roughness rather than regularly/uniformly patterned surfaces. The cavity formation, having a depth into the surface of the imaging member, is also advantageous for being more robust toward paper abrasion than bump formations, or formations protruding from the imaging member surface. It is important for the dampening fluid or fountain solution to be pinned at a contact line or edge of the non-imaging region. Otherwise, evaporation of the fluid during imaging by laser patterning may cause pullback, causing image distortion. The regular pattern cavity array may be formed using a silicon wafer mold in some embodiments. In other embodiments, methods may include preparing a flexible mold by thermal embossing processes now known or later developed.

Apparatus and systems of embodiments include an imaging member such as a plate or blanket having an imaging surface textured with a regular array of bumps and/or cavities. Preferably, apparatus and systems include an imaging surface textured with a regular array of cavities closely spaced together. Embodiments include methods for producing such textured imaging members.

Figure 3:
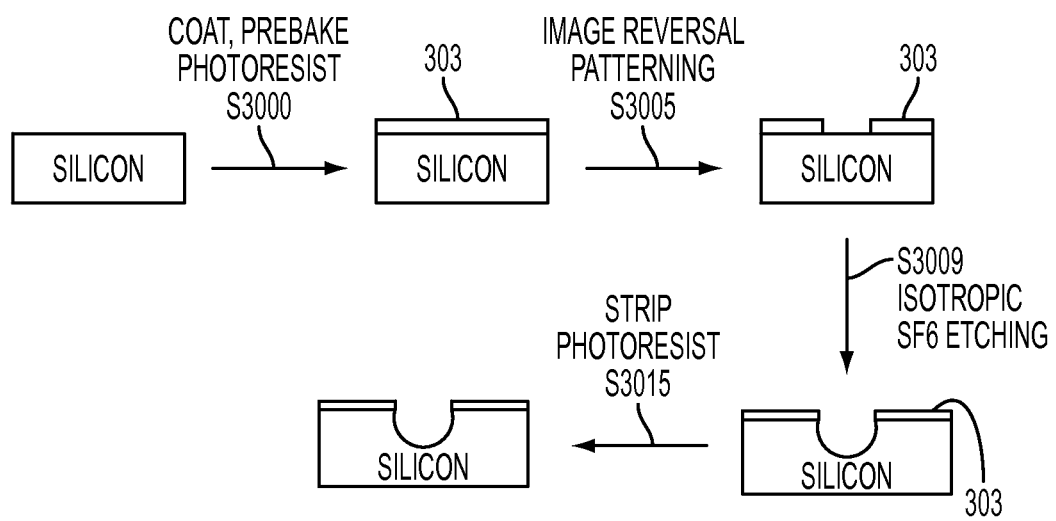
FIG. 3 shows a process for producing a textured imaging member mold for an imaging member surface having a regular microstructure array or pattern in accordance with an embodiment.

FIG. 3 shows a process for producing a textured imaging member mold for an imaging member surface having a regular microstructure array or pattern in accordance with an embodiment. In particular, FIG. 3 shows a photolithographic process for forming a mold to create microscopic hemispherical bumps or protrusions, and cavities or trenches on a fluorosilicone imaging member surface, i.e., a plate or blanket for digital ink-based printing. The regular array or pattern of microstructures enables control over wetting and dewetting of dampening fluid or fountain solution such as D4, and inks useful for ink-based digital printing.

In FIG. 3 shows a silicon wafer that may be coated with photoresist material and cured to form a photoresist layer 303 at S3000. Image reversal or patterning may be performed at S3005 to form a pattern in the photoresist layer 303. Etching such as isotropic SF6 etching may be performed at S3009 to form a cavity in the silicon wafer. The photoresist layer 303 is stripped at S3015 to form an imaging member textured surface mold.

Figure 4A:
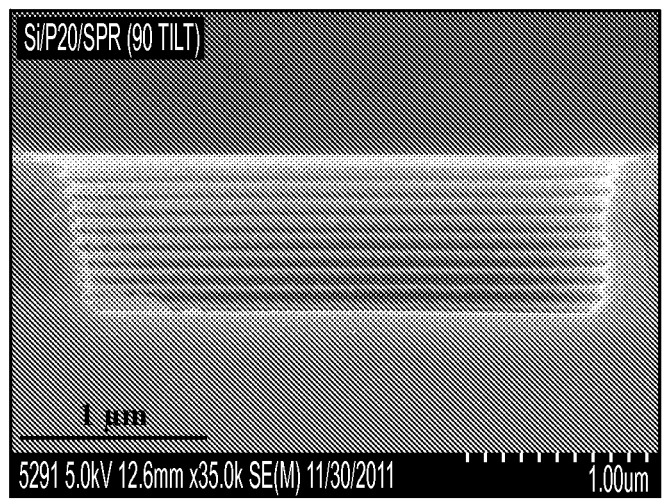
FIG. 4A shows a scanning electron micrograph (SEM) of a silicon mold including a photoresist pattern on silicon wafer as may be produced by the process of FIG. 3.
Figure 4B:
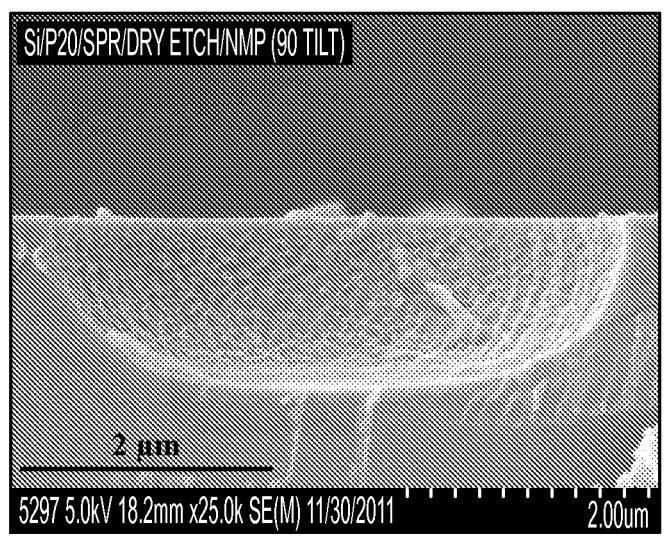
FIG. 4B shows an etched silicon wafer with micrometer scale cavities or trenches as may be produced by the process of FIG. 3.

FIG. 4A shows a scanning electron micrograph of a silicon mold including a photoresist pattern on silicon wafer as may be produced at S3005 of FIG. 3. FIG. 4B shows an etched silicon wafer with micrometer scale cavities or trenches as may be produced by isotropic SF6 etching at S3009 and stripping at S3015 of FIG. 3.

The semicircular or hemispherical cavities may be formed using a negative photoresist, e.g., nLOF 2020, or a positive photoresist (SPR). For a negative photoresist, the nLOF 2020 may be coated and prebaked on the silicon substrate, and then exposed and developed using a mask with feature size of 3 micron diameter and center to center spacing of 4.5 micron, for example. Then the silicon may be etched using isotropic SF6 etching. The photoresist layer may then be stripped as shown at S3015 of FIG. 3. Such methods may be used to form cavities of 0.5 microns to 1 micron in depth on a silicon wafer.

Alternatively, an SPR may be used and an image reversal process performed, followed by isotropic SF6 etching to form cavities on the silicon. The photoresist layer may then be stripped away to form hemispherical cavities in the silicon.

Alternatively, finer patterns on the order of submicron or nanometer scale on silicon wafer can also be created by e-beam lithography. In addition, laser patterning techniques can also be used to pattern the silicon wafers.

The mold may then be used to form a textured imaging member in accordance with embodiments as shown in FIG. 5. In particular, FIG. 5 shows an imaging member forming process 500. A silicon mold 501 having regularly arranged surface cavities produced by methods discussed above is coated at S5021 with an imaging member surface material layer 503 comprising fluorosilicone and 10% iron oxide, for example. The applied material layer 503 is cured between 110 degrees Celcius to 160 degrees Celsius for 4-6 hours. at S5025. The cured material layer 503 is removed from the silicon mold at S5031 for use as a surface layer of an imaging member configured for ink-based digital printing, or for producing a material layer defining cavities. The removed material layer 503 includes protrusions formed on the surface thereof.

FIG. 6 shows an imaging member forming process 600 wherein a surface layer of an imaging member includes regularly arranged cavities formed therein. In particular, FIG. 6 shows a removed material fluorosilicone layer 601 having bumps, onto which an imaging member surface material layer 603 is applied at S6021. The surface material layer may comprise fluorosilicone and 10% iron oxide, for example. The applied surface material layer 603 is cured at 160° C. for four hours at S6025. At S6031, the cured surface material layer 603 is removed from the fluorosilicone layer 601. The removed material layer 603 includes cavities or trenches formed therein.

Figure 7A:
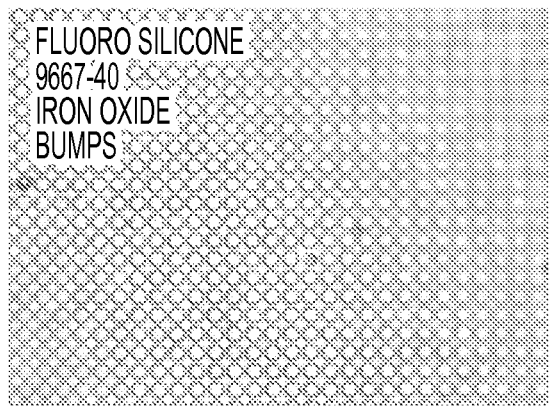
FIG. 7A shows an optical micrograph of a fluorosilicone imaging member or plate having bumps formed by methods in accordance with embodiments.
Figure 7B:
FIG. 7B shows an optical micrograph of a fluorosilicone imaging member or plate having cavities formed by methods in accordance with embodiments.

FIG. 7A shows an optical micrograph of a fluorosilicone imaging member or plate having bumps formed by methods in accordance with the above discussed embodiments. FIG. 7B shows an optical micrograph of an optical micrograph of a fluorosilicone imaging member or plate having cavities formed by methods in accordance with the above discussed embodiments. The surface texture features are reproducible with substantially, if not exactly, the same shapes and dimension over a large area of the plate.

Figure 8A:
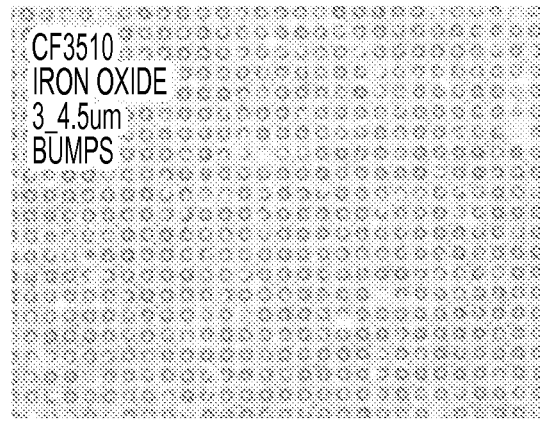
FIG. 8A shows an optical micrograph of fluorosilicone imaging member or plate with microscopic bumps in accordance with an embodiment.
Figure 8B:
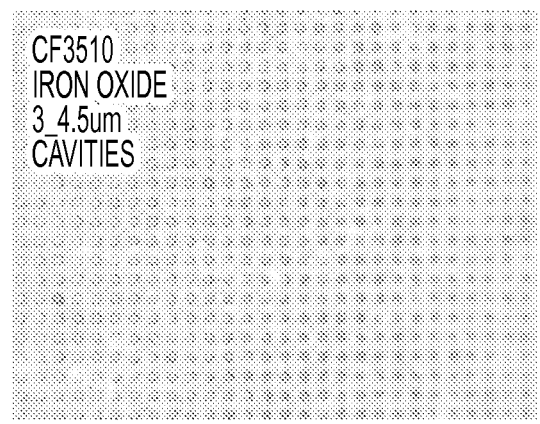
FIG. 8B shows an optical micrograph of fluorosilicone imaging member or plate with microscopic cavities in accordance with an embodiment.

FIG. 8A shows an optical micrograph of fluorosilicone imaging member or plate with microscopic bumps. The fluorosilicone is a different formulation than that used in FIG. 7A. Different fluorosilicone formulations may exhibit different feature reproducibility, which may also be enhanced by optimizing curing conditions, and by addition of fumed silica. FIG. 8B shows an optical micrograph of fluorosilicone imaging member or plate with microscopic cavities.

Figure 9A:
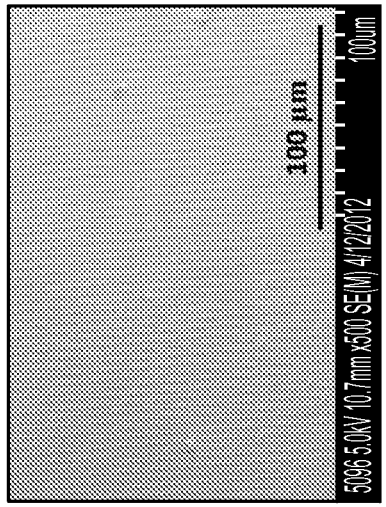
FIG. 9A shows an SEM micrograph of fluorosilicone plate with microscopic bumps in accordance with an embodiment.
Figure 9B:
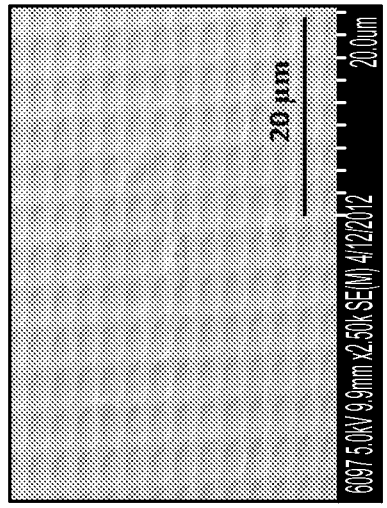
FIG. 9B shows an SEM micrograph of fluorosilicone plate with microscopic cavities in accordance with an embodiment.
Figure 9C:
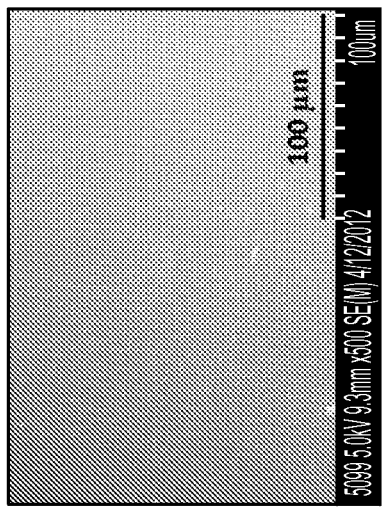
FIG. 9C shows an SEM micrograph of fluorosilicone plate with microscopic bumps at a higher magnification than that used for FIG. 9A.
Figure 9D:
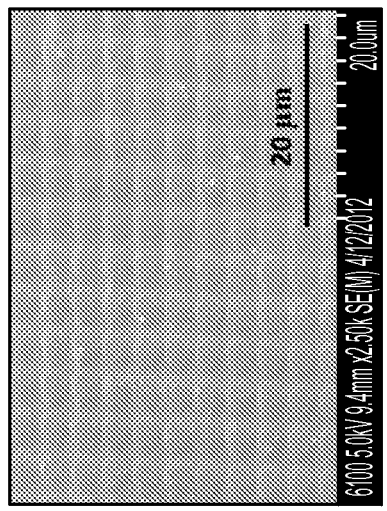
FIG. 9D shows an SEM micrograph of fluorosilicone plate with microscopic cavities at a higher magnification than that used for FIG. 9B.

FIG. 9A shows an SEM micrograph of fluorosilicone plate with microscopic bumps. FIG. 9B shows an SEM micrograph of fluorosilicone plate with microscopic cavities. FIG. 9C shows an SEM micrograph of fluorosilicone plate with microscopic bumps at a higher magnification than that used for FIG. 9A. FIG. 9D shows an SEM micrograph of fluorosilicone plate with microscopic cavities at a higher magnification than that used for FIG. 9B. The bumps and cavities shown in FIGS. 9A and 9C and 9B and 9D, respectively, have a height/depth in a range of 0.5 microns to 0.7 microns.

Other than silicone and fluorosilicone, fluoroelastomers ("FKM"s) and hybrids of FKM and silicone or fluorosilicone can also be used to form the imaging plate substrates for transferring the patterns from the mold.

Figure 10B:
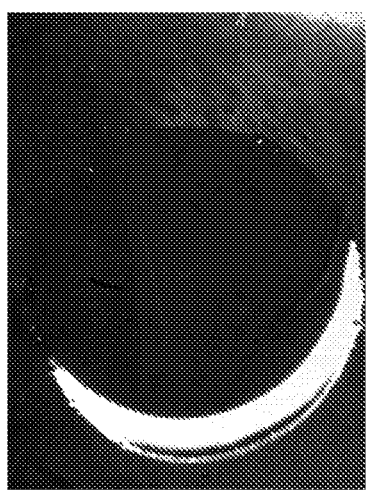
FIG. 10B shows a spread D4 drop on a random texture fluorosilicone plate surface.
Figure 10C:
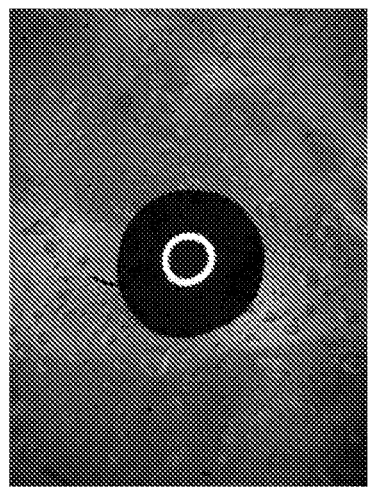
FIG. 10C shows a spread D4 drop on a regular texture fluorosilicone plate surface.
Figure 10A:
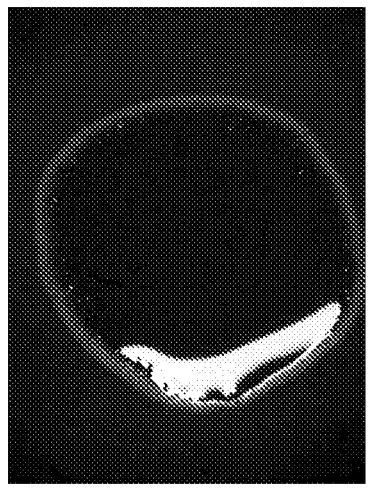
FIG. 10A shows a spread D4 drop on a smooth fluorosilicone plate surface.

Wetting experiments were carried out on fluorosilicone bumps and cavities, and the results compared with smooth fluorosilicone, and randomly textured fluorsilicone. The experiments were carried out using D4 solution. The wetting study was performed by gently placing a 2 microliter drop of D4 on the plate material, and taking a high speed (60 frames/sec) video recording of the spreading drop. The final diameter to which a 2 micro liter drop was found to spread on different imaging member surfaces is shown in FIGS. 10A-10C. FIG. 10A shows a spread drop on a smooth fluorosilicone plate surface. The D4 solution spread and wet uncontrollably. FIG. 10B shows a spread drop on a random texture fluorosilicone plate surface. The D4 solution spread and wet uncontrollably. FIG. 10C shows a spread drop on a regular texture fluorosilicone plate surface, the regular texture comprising cavities. The D4 solution pinned well on the cavity surface.

Figure 11:
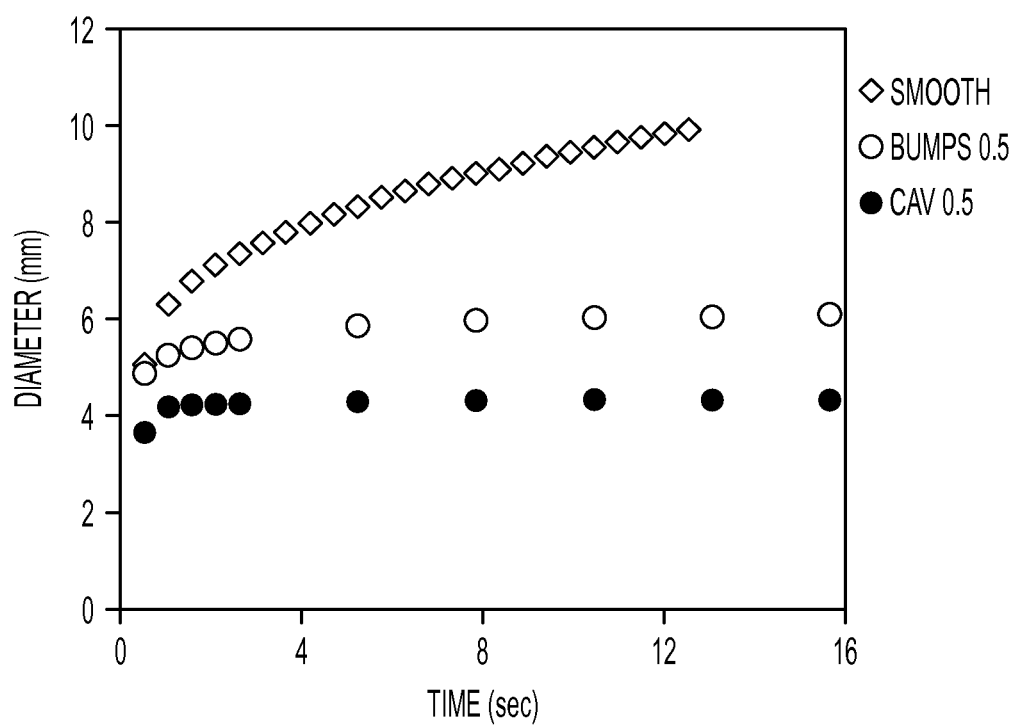
FIG. 11 shows graphed data pertaining to D4 solution spreading of 2 microliter drops on fluorosilicone plate surfaces.

FIG. 11 shows graphed data pertaining to D4 solution spreading of 2 microliter drops on fluorosilicone plate surfaces that are one of smooth, textured with bumps, or textured with cavities. The bumps/cavities had a height/depth of 0.5 microns. The drop diameters were measured as a function of time. D4 spreads to a larger diameter of about 10 millimeters on smooth fluorosilicone, whereas D4 drops are pinned to a diameter of about 4 and about 6 millimeters on fluorosilicone plates having cavities and bumps, respectively.

Figure 12A:
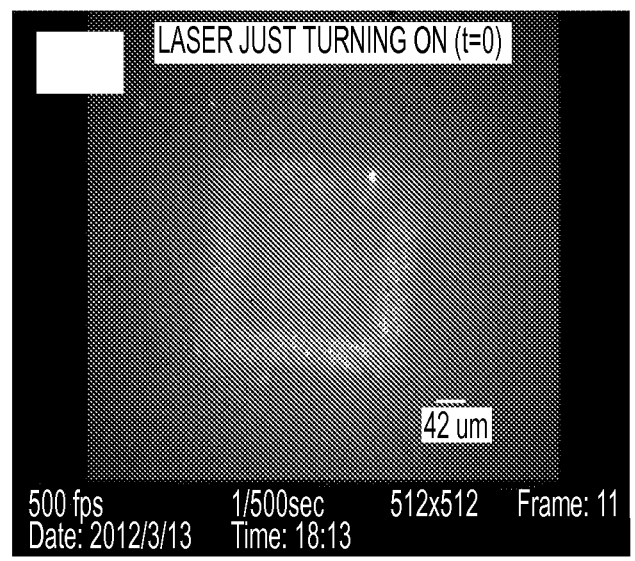
FIG. 12A shows an image taken during laser exposure of fountain solution on a textured imaging member surface in accordance with an embodiment.
Figure 12B:
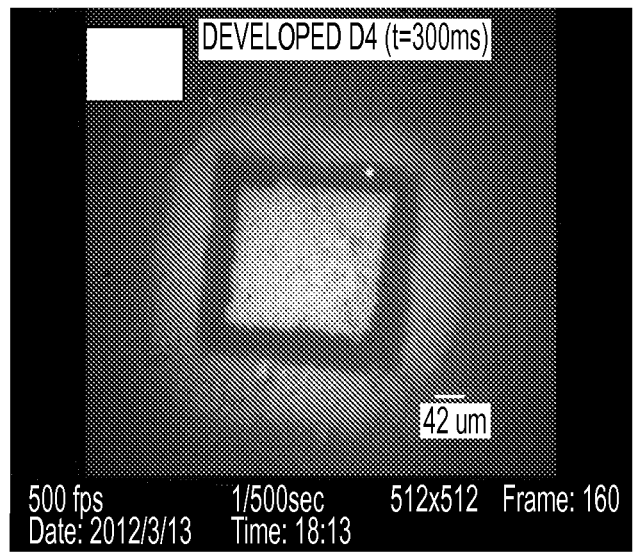
FIG. 12B shows the textured surface of 12A after fountain solution has evaporated.

FIG. 12A shows an image taken during pullback studies wherein laser was applied to the textured surface having fountain solution. FIG. 12B shows the textured surface of 12A after D4 has evaporated from laser exposure, leaving pinned D4. The textured surface helps pin the D4, minimizing pullback, improving image quality, and improving print process latitude.

Alternative methods for imaging member textured surface formation may include manufacture by thermal embossing. In thermal embossing methods, a negative replica from the silicon cavity structure can be embossed onto a suitable polymer sheet (e.g., polyimide and MYLAR) by appropriate temperature and pressure. Then, the bump surface on the polymer sheet coated with a release layer comprising 1H, 1H, 2H, 2H-perfluorooctyl trichlorosilane ("FOTS") or perfluorodecyltrichlorosilane ("FTDS") can serve as the mold to create cavity structures on fluorosilicones. An advantage of thermal embossing onto a flexible polymer sheet is that the fluorosilicones can be flow-coated by wrapping the textured surface onto the flow-coated fixture.

Apparatus include an imaging member having a textured surface. The surface texture may comprise bumps or cavities. Preferably, the textured surface comprises regularly arranged microstructures that comprise cavities or bumps having a depth or height, respectively, of 0.1 to 1 micron, and preferably 0.1 to 0.7 micron. Preferably the microstructures have a spacing of 0.5 microns to 6 microns, wherein the spacing is a center-to-center distance between structures.

Methods include forming an imaging member having a textured surface using photolithography and molding methods as discussed above by way of example with reference to embodiments. Textured imaging member fluorosilicone surfaces enabled dampening fluid or fountain solution pinning at the contact line during laser evaporation of fluid, thereby reducing pullback and providing an additional adjustable parameter for increasing print process latitude between pullback and background. Background refers to ink penetration through dampening fluid, which results in inking of non-imaging areas.

It will be appreciated that the above-disclosed and other features and functions, or alternatives thereof, may be desirably combined into many other different systems or applications. Also, various presently unforeseen or unanticipated alternatives, modifications, variations or improvements therein may be subsequently made by those skilled in the art.

What is claimed is:

1. An imaging member for ink-based digital printing, comprising:

a textured imaging surface, the textured imaging surface having a plurality of microstructures arranged in a regular pattern configured for enhancing control over wetting and dewetting of dampening fluid, the microstructures being substantially hemispherical, and the plurality of microstructures further comprising cavities, the cavities being defined by the imaging member surface, wherein the cavities have a depth lying in a range of 0.1 microns to 1.0 micron, wherein the cavities are arranged whereby adjacent cavities are equally spaced from each other by a distance of 0.5 microns to 6 microns.

2. The apparatus of claim 1, the textured imaging surface further comprising materials selected from the group comprising silicone, fluorosilicone, fluoroelastomers (FKMs), and hybrids of FKMs, fluorosilicones, and silicones.

3. The apparatus of claim 2, the textured imaging surface further comprising iron oxide or carbon black or graphene or carbon nanotube or any other suitable Infrared (IR) fillers.

4. The apparatus of claim 1, wherein the cavities have a depth lying in a range of 0.2 microns to 0.7 microns.

* * * * *